United States Patent
Miller et al.

(10) Patent No.: US 11,650,256 B2
(45) Date of Patent: May 16, 2023

(54) TESTING APPARATUS FOR TESTING LEAD ACID BATTERIES AND THEIR COMPONENTS, AND METHODS AND SYSTEMS INCORPORATING THE SAME

(71) Applicant: Daramic, LLC, Charlotte, NC (US)

(72) Inventors: Eric H. Miller, Philpot, KY (US); James P. Perry, Utica, KY (US); Nicholas R. Shelton, Owensboro, KY (US); Gregory L. Hall, Owensboro, KY (US)

(73) Assignee: Daramic, LLC, Charlotte, NC (US)

( * ) Notice: Subject to any disclaimer, the term of this patent is extended or adjusted under 35 U.S.C. 154(b) by 414 days.

(21) Appl. No.: 16/651,634

(22) PCT Filed: Sep. 28, 2018

(86) PCT No.: PCT/US2018/053311
§ 371 (c)(1),
(2) Date: Mar. 27, 2020

(87) PCT Pub. No.: WO2019/067839
PCT Pub. Date: Apr. 4, 2019

(65) Prior Publication Data
US 2020/0333401 A1   Oct. 22, 2020

Related U.S. Application Data

(60) Provisional application No. 62/565,205, filed on Sep. 29, 2017.

(51) Int. Cl.
*G01R 31/379* (2019.01)
*G01M 7/06* (2006.01)
(Continued)

(52) U.S. Cl.
CPC ............. *G01R 31/379* (2019.01); *G01M 7/06* (2013.01); *G01M 99/004* (2013.01);
(Continued)

(58) Field of Classification Search
CPC ........................... G01R 31/379; G01R 31/385; G01R 31/3644; G01R 31/36; G01M 7/06;
(Continued)

(56) References Cited

U.S. PATENT DOCUMENTS 4,360,780 A    11/1982  Skutch, Jr.
5,079,111 A *   1/1992  Wheadon ................. H01M 4/21
                                                                429/225
(Continued)

FOREIGN PATENT DOCUMENTS

CN          102073019 B  *  1/2013
DE       112013006982 T5 *  4/2016  ............ B60L 11/182
(Continued)

OTHER PUBLICATIONS

Written Opinion and Search Report dated Jan. 11, 2019; from counterpart PCT Application No. PCT/US2018/053311.
(Continued)

*Primary Examiner* — Richard Isla
*Assistant Examiner* — Dung V Bui
(74) *Attorney, Agent, or Firm* — Hammer & Associates, LLC

(57) ABSTRACT

In accordance with at least selected embodiments, the present disclosure or invention is directed to novel or improved testing apparatus for testing lead acid batteries and/or their components, and/or the efficacy of their components, testing tables, testing systems, and/or related methods. In accordance with at least certain embodiments, the present disclosure or invention is directed to novel or improved methods for testing lead acid batteries and/or their components,
(Continued)

and/or the efficacy of their components. In accordance with at least certain selected embodiments, the present disclosure or invention is directed to novel or improved systems for testing lead acid batteries and/or their components, and/or the efficacy of their components. In accordance with at least particular selected embodiments, the present disclosure or invention is directed to novel or improved apparatus and methods for testing a lead acid battery or batteries whereby the battery or batteries are subjected to motion typical of that experienced by the battery or batteries in use or in the field.

46 Claims, 14 Drawing Sheets

(51) Int. Cl.
*G01R 31/385* (2019.01)
*G01M 99/00* (2011.01)
*G01R 31/36* (2020.01)
*H01M 10/06* (2006.01)
*H01M 10/42* (2006.01)
*H01M 50/463* (2021.01)

(52) U.S. Cl.
CPC ....... *G01R 31/3644* (2013.01); *G01R 31/385* (2019.01); *H01M 10/06* (2013.01); *H01M 10/42* (2013.01); *H01M 50/463* (2021.01)

(58) Field of Classification Search
CPC .... G01M 99/00; G01M 99/004; H01M 10/06; H01M 10/42
USPC ........................................................ 324/426
See application file for complete search history.

(56) References Cited

U.S. PATENT DOCUMENTS

| | | | | |
|---|---|---|---|---|
| 5,545,967 | A * | 8/1996 | Osborne | B60L 53/305 |
| | | | | 320/109 |
| 2011/0297470 | A1 | 12/2011 | Heichal et al. | |
| 2013/0309554 | A1* | 11/2013 | Dhar | H01M 50/512 |
| | | | | 429/225 |
| 2014/0120417 | A1* | 5/2014 | Matsushita | B60L 3/0046 |
| | | | | 429/211 |
| 2015/0318529 | A1 | 11/2015 | Whear et al. | |

FOREIGN PATENT DOCUMENTS

| | | | |
|---|---|---|---|
| MA | 20150460 A1 * | 5/2014 | |
| WO | WO001998045722 | 10/1998 | |

OTHER PUBLICATIONS

IPRP dated May 26, 2020; from counterpart PCT Application No. PCT/US2018/053311.

* cited by examiner

Daramic® Serrated Rib

Daramic® RipTide® Rib

KEY BATTERY TESTING APPLICATIONS

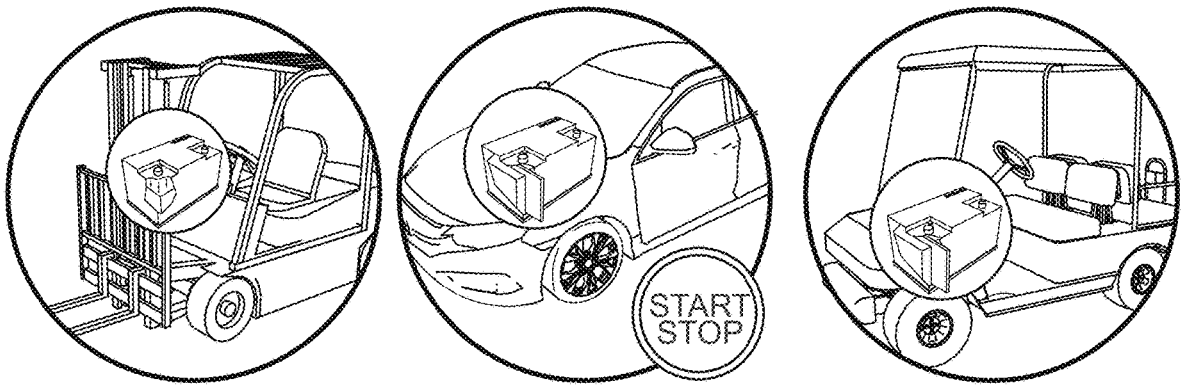

OTHER FEATURES

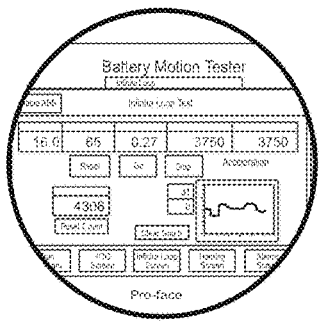
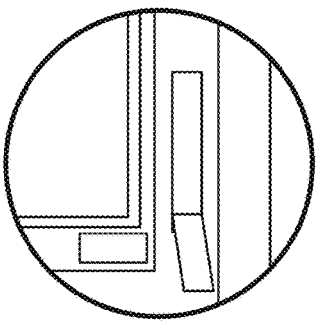
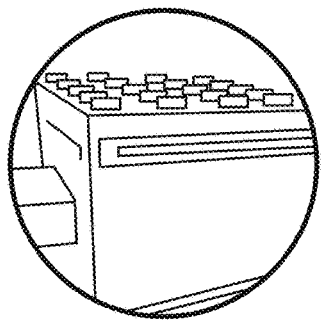

An advanced control panel allows programming of desired testing parameters including acceleration, time between movements, and cycles Data is collected via external drive and easily transferred using USB ports on the machine Versatile t-slotted rail system allows for quick and adjustable tie down of batteries in multiple configurations and sizes

FIG. 13

In yet another example:

Daramic Computer Modeling Capabilities

By Simulating the start-stop motion resulting from vehicle acceleration and braking, computational fluid dynamic (CFD) modeling capabilities has enabled Daramic to design separators that promote electrolyte mixing with the battery.

Electrolyte Mixing Model - Optimized Mixing Rib Design

STAR-CCM +

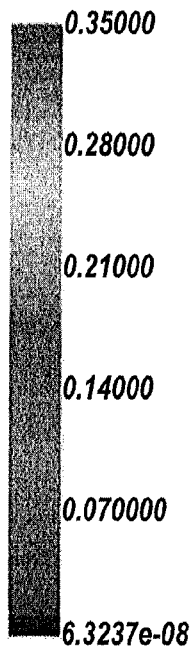

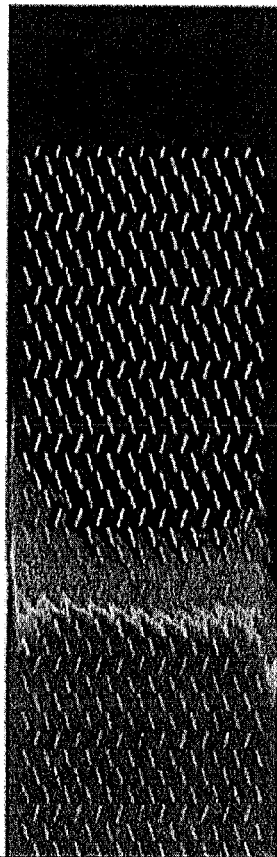

FIG. 15

In still another example:

Daramic example preferred Test Conditions for
12V Lead-acid Enhanced Flooded Start-Stop Vehicle Battery When active or no mixing devices are used, the test is carried out in a water bath at 26.7± 3° C. The battery will remain submerged to no more than 3cm below the case/cover seal throughout the test. If passive mixing devices are used, the test is carried out actively on a motion table in air at room ambient temperature of 25.0± 3° C. A passive mixing device is any internal component that promotes electrolyte mixing without the input of electrical energy.

Note on the motion table test when using mixing elements:

The mechanical movement takes place on a shuttling device that moves laterally around the battery, see FIG. 16. The battery is to be restrained and preferably oriented on the device with internal prismatic plates parallel to motion (Battery may be positioned with inter plates at 45° angle to motion upon formal approval

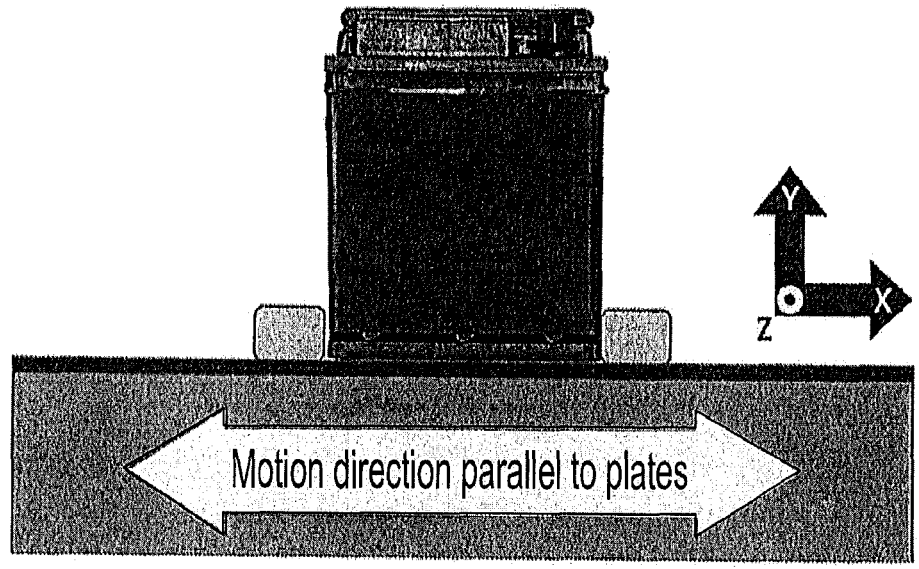

from the Engineering Department).

FIG. 16 - Diagram of the shuttle motion

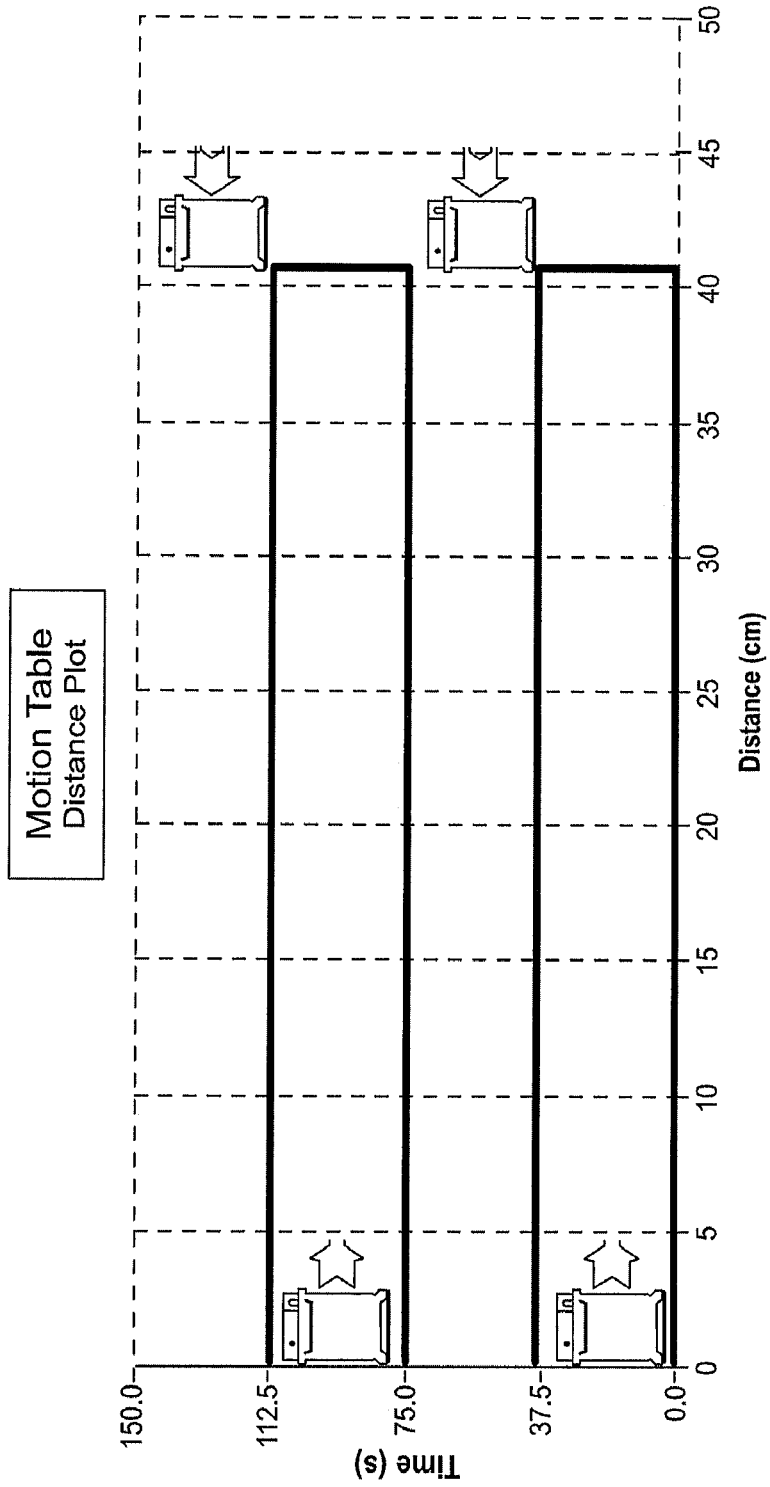
FIG. 17 - Displacement over time during motion test

TESTING APPARATUS FOR TESTING LEAD ACID BATTERIES AND THEIR COMPONENTS, AND METHODS AND SYSTEMS INCORPORATING THE SAME

FIELD

In accordance with at least selected embodiments, the present disclosure or invention is directed to novel or improved testing apparatus for testing lead acid batteries and/or their components, and/or the efficacy of their components, testing tables, testing systems, and/or related methods. In accordance with at least certain embodiments, the present disclosure or invention is directed to novel or improved methods for testing lead acid batteries and/or their components, and/or the efficacy of their components. In accordance with at least certain selected embodiments, the present disclosure or invention is directed to novel or improved systems for testing lead acid batteries and/or their components, and/or the efficacy of their components.

BACKGROUND

Lead acid batteries have many applications ranging from consumer to industrial uses. Some applications find the battery in a stationary setting, while many applications of lead acid batteries are found in vehicles and spend their service life in motion or experience vibration. However, with the exception of field testing in vehicles, testing batteries in a lab is typically done in a stationary setting with elevated temperatures to some extent simulate usage conditions and facilitate reduced test times.

Deep cycle lead acid batteries, such as those used in golf carts (also known as golf cars), forklifts, e-rickshaws, e-bikes, idle-stop-start ("ISS") vehicles, and the like, operate nearly constantly in a partial state of charge ("PSoC"). Such batteries, with the possible exception of ISS batteries, are used for 8-12 hours or more being discharged before they are charged. Furthermore, the operators of those batteries may not over-charge the batteries before returning them to service. ISS batteries experience cycles of discharge and brief intermittent charging cycles, and generally rarely achieve a full charge or are ever overcharged. These batteries and others, are both prone to acid stratification, acid starvation, or both. These batteries (or areas within the battery) are therefore subject to periods in which the electrolyte has a high water concentration. These batteries (or areas within the battery) are also subject to periods in which the electrolyte has a higher acid concentration. These conditions may lead to a variety of problems, such as: for example, reduced battery life; reduced cycle performance; reduced charge acceptance; battery or cell shorting; and combinations thereof.

As shown in FIG. 1A, an exemplary lead acid battery 50 is shown having a positive terminal 51 and a negative terminal 53. Within the battery 50 is an array of alternating positive plates or electrodes 52 and negative plates or electrodes 54 with a separator 60 disposed therebetween each positive electrode 52 and negative electrode 54. The positive and negative electrodes 52, 54, and separators 60 are substantially submerged within an aqueous electrolyte solution 56. The electrolyte may be, for example, a solution of sulfuric acid ($H_2SO_4$) and water ($H_2O$). The electrolyte solution may have, for example, a specific gravity of approximately 1.28, with a range of approximately 1.215 to 1.300. The positive electrodes 52 are in electrical communication with the positive terminal 51, and the negative electrodes 54 are in contact with the negative terminal 53. A typical cell of a typical lead acid battery is shown in FIG. 1B.

FIG. 1B is also a schematic representation of a typical lead acid battery cell experiencing acid stratification as may be seen in certain lead acid batteries. Sulfuric acid is heavier than water and will tend to settle to the bottom portion of the electrolyte leaving the bottom of the electrolyte at a higher than optimal specific gravity and the top of the electrolyte predominantly water with a lower than optimal specific gravity. This acid stratification affects both the performance and life of the battery as the upper portions of the electrodes are starved of acid while only the lower portions of the electrodes are in contact with the sulfuric acid. Acid stratification can be mitigated by overcharging the battery or keeping it charged at or near 100% capacity. During overcharging, gas bubbles tend to form on the electrodes and/or separators and rise to the surface providing a mixing action to the electrolyte.. In continuous conditions wherein the battery is in a PSoC, this overcharging action never occurs and the extent to which the electrolyte is stratified becomes greater.

It is noted that FIGS. 1A-1B are not drawn to scale. It is also noted that in a typical lead acid battery, the positive electrode 52 is in intimate contact with the separator 60, and likewise, the negative electrode 54 is also in intimate contact with the separator 60. The separator serves to keep the positive and negative electrodes (or plates) 52, 54 separate and prevent the battery from shorting. The separator 60 may be a leaf, piece, fold, wrap, sleeve, pocket, envelope, or hybrid envelope (with openings) also be combined with a fibrous mat or glass mat (or mats, plate wrap, and/or the like, not shown) and may be structured so as to separate, wrap, sleeve, pocket, or envelope one or both of the electrodes 52, 54.

In addition to acid stratification and/or acid starvation, other batteries in motion experience vibration during their use. Such vibrations may lead to such problems as positive active material ("PAM") shedding or negative active material ("NAM") shedding.

This may lead to a reduced battery life, reduced cycle performance, reduced charge acceptance, and combinations thereof.

Certain inventions have been developed by Daramic to assist in mixing the electrolyte while the battery is in motion to accomplish acid mixing, thermal distribution, gas release, and/or the like. One such invention is the Daramic® RipTide™ acid mixing rib profile separator. Another invention is the Daramic® Shield™ line of separators that are designed to reduce PAM and/or NAM shedding. These components and others would benefit greatly by being tested while subjected to real-world applications of motion. Many battery manufacturers test batteries in a lab with the batteries being stationary, and only control or vary the temperature of the battery to determine its life or cold cranking amp. Some battery manufacturers and suppliers test batteries in the lab using a rocker table that pivots about a single axis. However, this motion is not representative of the motion that a battery will experience during use by the end user. Further, this motion has different effects on batteries of differing heights. Still further, these rocker tables do not subject the batteries to any vibration that they may experience during their use. Therefore, a need exists to effectively test batteries in a lab setting that will have the batteries experience motion and/or vibration that such a battery would experience during typical battery use by the end user.

SUMMARY

The details of one or more embodiments are set forth in the descriptions below. Other features, objects, and advantages will be apparent from the description and from the claims. In accordance with at least select embodiments, the present disclosure or invention may address the above issues or needs. In accordance with at least certain objects, aspects, or embodiments, the present disclosure or invention may address the above problems, needs or issues, and/or may provide an improved apparatus and method for testing batteries that are subjected to motion and/or vibration by their end users and that may also address or overcome the aforementioned problems, needs or issues. Such apparatus and/or methods may be especially well suited to show the advantages of certain new acid mixing battery separators.

In accordance with at least selected embodiments, the present disclosure or invention is directed to novel or improved testing apparatus for testing lead acid batteries and/or their components, and/or the efficacy of their components, testing tables, testing systems, and/or related methods. In accordance with at least certain embodiments, the present disclosure or invention is directed to novel or improved methods for testing lead acid batteries and/or their components, and/or the efficacy of their components. In accordance with at least certain selected embodiments, the present disclosure or invention is directed to novel or improved systems for testing lead acid batteries and/or their components, and/or the efficacy of their components. In accordance with at least particular selected embodiments, the present disclosure or invention is directed to novel or improved apparatus and methods for testing a lead acid battery or batteries whereby the battery or batteries are subjected to motion typical of that experienced by the battery or batteries in use or in the field, are subjected to more severe motion than that typically experienced by the battery or batteries in use or in the field, are subjected to motion and/or vibration typical of that experienced by the battery or batteries in use or in the field, are subjected to more severe motion and/or vibration than that typically experienced by the battery or batteries in use or in the field, are subjected to heat, motion and/or vibration typical of that experienced by the battery or batteries in use or in the field, are subjected to more severe heat, motion and/or vibration than that typically experienced by the battery or batteries in use or in the field, are subjected to cold, motion and/or vibration typical of that experienced by the battery or batteries in use or in the field, are subjected to more severe cold, motion and/or vibration than that typically experienced by the battery or batteries in use or in the field, and/or the like.

In a first exemplary embodiment of the present disclosure or invention, a method provides at least one lead acid battery; subjecting the lead acid battery or batteries to motion; wherein the motion is translating the lead acid battery or batteries in a first degree of freedom; the motion is rotating the lead acid battery or batteries in a second degree of freedom; and at least partially cycling the lead acid battery or batteries during the motion.

In one exemplary aspect of an embodiment, the first degree of freedom is the same as the second degree of freedom. In another aspect, the motion is translating the battery or batteries in a third degree of freedom, and/or an additional fourth degree of freedom. The motion may also be rotation about a third degree of freedom, and/or an additional fourth degree of freedom.

In another exemplary aspect, the electrolyte in the battery or batteries may be mixed. In addition, the temperature of the battery or batteries or the ambient humidity may be controlled.

In another exemplary aspect of the present invention, the motion may mimic the acceleration and deceleration of a vehicle. The motion may also mimic that of a vehicle during typical stop/start driving. The vehicle may be an automobile, a truck, a motorcycle, an all-terrain vehicle, a forklift, a golf cart, a hybrid-electric vehicle, an electric vehicle, an idle-stop-start vehicle, an e-rickshaw, an e-trike, an e-bike, a train, a ship or boat ("vessel"), and/or the like.

In yet another aspect of an embodiment of the present invention, the battery or batteries may be a flooded lead acid battery, an enhanced flooded lead acid battery, an idle-stop-start vehicle lead acid battery, an automobile battery, a truck battery, a motorcycle battery, an all-terrain vehicle battery, a forklift battery, a golf cart battery, a hybrid-electric vehicle battery, an electric vehicle battery, an e-rickshaw battery, an e-trike battery, an e-bike battery, a vessel, and/or the like.

In still another aspect of the present disclosure or invention, the method may test a battery or batteries while at least partially cycling them while the battery or batteries are in motion. The partial cycling may be at least partially discharging, at least partially charging, or a combination thereof. The method may include testing a battery or batteries in motion in a partial state of charge ("PSoC").

In yet another aspect of the present disclosure or invention, the method may also secure the battery or batteries to a generally planar platform. The first degree of freedom may be a first axis parallel to the generally planar platform, not parallel to the generally planar platform, or even orthogonal to the generally planar platform. In addition, the second degree of freedom may be a first axis parallel to the generally planar platform, not parallel to the generally planar platform, or even orthogonal to the generally planar platform. Furthermore, the second degree of freedom may be an axis coaxial with the first axis, not parallel to the first axis, and even orthogonal to the first axis.

In another exemplary embodiment of the present disclosure or invention, a system may be provided with at least one lead acid battery, a generally planar platform capable of securing the battery or batteries and movable in at least four degrees of freedom, and circuitry for at least partially cycling the battery or batteries. The cycling may be at least partially discharging the battery or batteries, at least partially charging the battery or batteries, or both at least partially charging and at least partially discharging the battery or batteries.

In at least one exemplary aspect of the system, the circuitry or a second circuitry may also be capable of controlling a motion of the generally parallel support platform about or along the at least four degrees of freedom, preferably about or along five degrees of freedom, and more preferably, along or about six degrees of freedom.

In yet another exemplary embodiment of the present disclosure or invention, a support apparatus for testing a lead acid battery may be provided with a generally planar support platform having one or more means of securing the lead acid battery. In at least one exemplary aspect, the support platform may be translatable along three separate axes, and rotatable about at least one axis of the three separate axes. The support platform may preferably be rotatable about at least two axes of the three separate axes, and more preferably rotatable about all three separate axes.

In still another exemplary embodiment of the present disclosure or embodiment, a support apparatus for testing a lead acid battery may be provided with a generally planar support platform having one or more means of securing the lead acid battery. In at least one exemplary aspect, the support platform may be rotatable about three separate axes, and translatable along at least one axis of the three separate axes. The support platform may preferably be translatable along at least two axes of the three separate axes, and more preferably translatable along all three separate axes. In accordance with at least selected embodiments, aspects, or objects, the present disclosure or invention addresses, provides, or is directed to novel or improved testing apparatus for testing lead acid batteries and/or their components, and/or the efficacy of their components, testing tables, testing systems, and/or related methods. In accordance with at least certain embodiments, the present disclosure or invention is directed to novel or improved methods for testing lead acid batteries and/or their components, and/or the efficacy of their components. In accordance with at least certain selected embodiments, the present disclosure or invention is directed to novel or improved systems for testing lead acid batteries and/or their components, and/or the efficacy of their components. In accordance with at least particular selected embodiments, the present disclosure or invention is directed to novel or improved apparatus and methods for testing a lead acid battery or batteries whereby the battery or batteries are subjected to motion typical of that experienced by the battery or batteries in use or in the field.

BRIEF DESCRIPTION OF THE FIGURES

FIGS. 10 to 13 provide information and images related to at least one embodiment of the inventive motion testing concept and equipment.

FIGS. 10 and 11 include respective front and partial top view photographic images of testing equipment.

FIG. 12 is an enlarged front view of the control panel of FIG. 10.

FIG. 13 includes images of several key battery testing applications and of several equipment features.

FIG. 15 provides information and an image related to at least one embodiment of Daramic electrolyte mixing modeling and rib design.

FIGS. (or Figures) 16 and 17 provide information and images related to at least one embodiment of the inventive motion test, concept and equipment.

FIGS. 16 and 17 include respective representations of the shuttle motion and of the displacement over time.

DETAILED DESCRIPTION

In accordance with at least select embodiments, the present disclosure or invention may address the above issues or needs. In accordance with at least certain objects, aspects, or embodiments, the present disclosure or invention may provide an improved battery testing apparatus, and methods and systems incorporating the same, which overcomes the aforementioned problems. For instance, the present disclosure or invention provides a testing table or platform that is capable of moving in six degrees of motion, namely translating or moving along three axes, as well as being able to rotate or pivot about three axes, and capable of mimicking the motion that a battery would see in use or in the field.

Figure 1A:
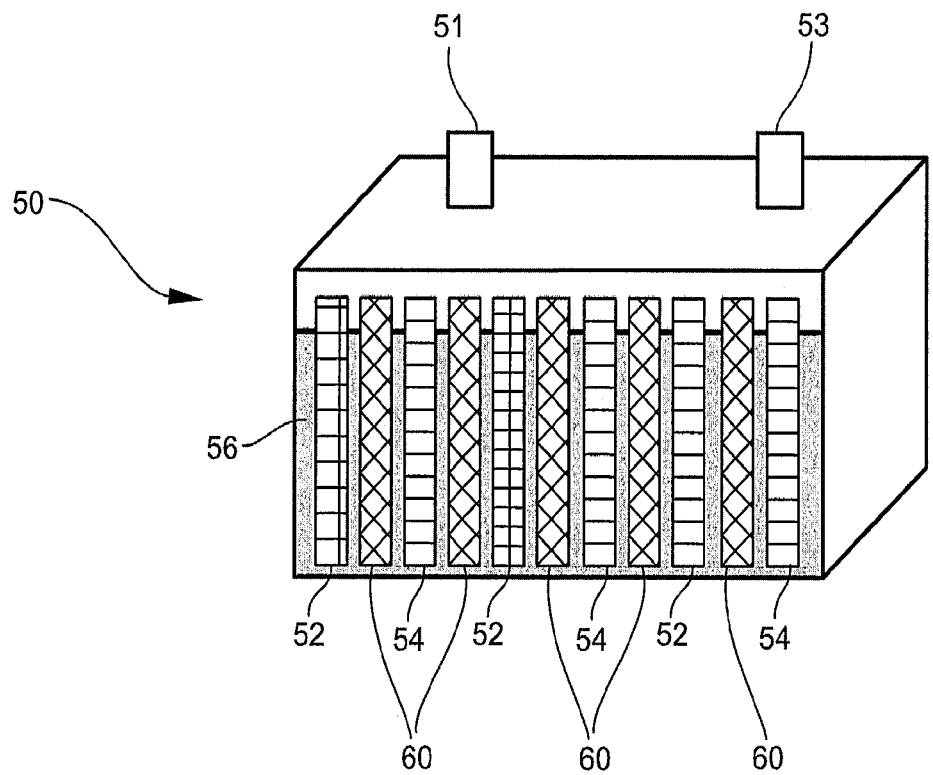
FIG. 1A illustrates a typical lead acid battery.
Figure 1B:
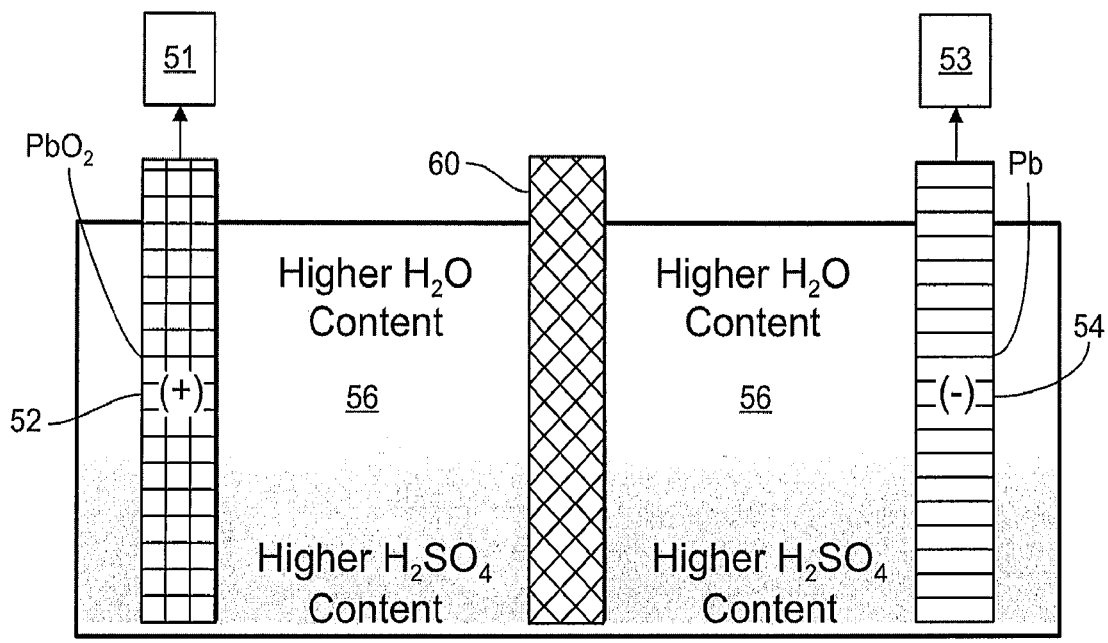
FIG. 1B is a schematic of a typical lead acid battery cell, further detailing acid stratification.
Figure 2:
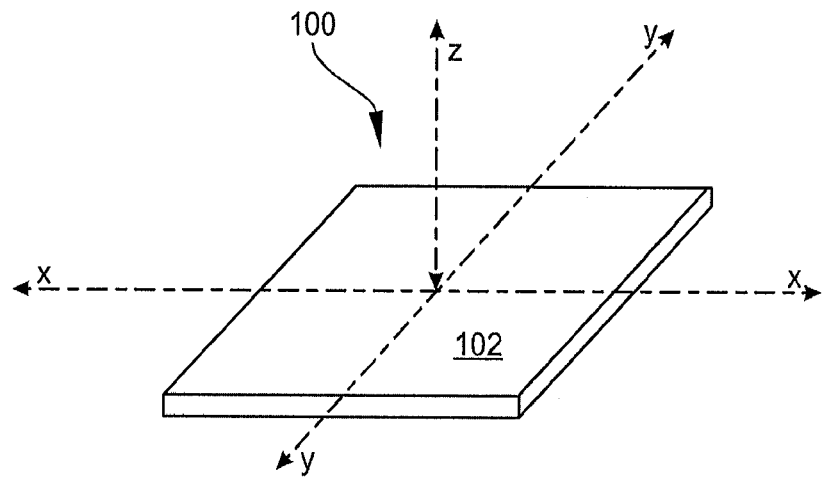
FIGS. 2 and 3 depict exemplary embodiments of a test platform of the present invention.

With reference now to FIG. 2, an exemplary embodiment of the testing apparatus 100 is provided with a generally planar support platform 102. Also illustrated for reference are an x-axis, y-axis, and z-axis. The platform is preferably capable of moving or translating along these axes as well as rotating or pivoting about them. Such motion along or about each axis is independent of each other, and may occur simultaneously as motion along or about the same or a different axis. Thus, the testing apparatus is capable of moving the test batteries in 1-dimensional motion, 2-dimensional motion, as well as 3-dimensional motion. For instance, the apparatus is preferably capable of simulating straight start/stop motion, turns, changes in elevation, and vibration. As an example, motion along or about multiple axes may be able to simulate a vehicle turning, or even turning while on a hill, and/or while on a bumpy road. Certain select embodiments may be capable of rotating about the x-axis, the y-axis, and/or the z-axis of a range from approximately 0° to approximately +/−360° or greater or less, and preferably a range from approximately 0° to approximately +/−180° or greater or less. In addition, exemplary embodiments of the testing apparatus are preferably capable of subjecting the batteries to a wide range of acceleration/deceleration (measured in g-force "g") in a range from approximately 0 g to approximately +/−2.0 g or greater or less, and preferably a range from approximately 0 g to approximately +/−1.0 g or greater or less, and more preferably in a range from approximately 0 g to approximately +/−0.75 g. furthermore, exemplary embodiments of the testing apparatus are preferably capable of subjecting the batteries to a wide range of rotational or angular acceleration/deceleration (measured in g-force "g") in a range from approximately 0 g to approximately +/−2.0 g or greater or less, and preferably a range from approximately 0 g is to approximately +/−1.0 g or greater or less, and more preferably in a range from approximately 0 g to approximately +/−0.75 g.

Figure 3:
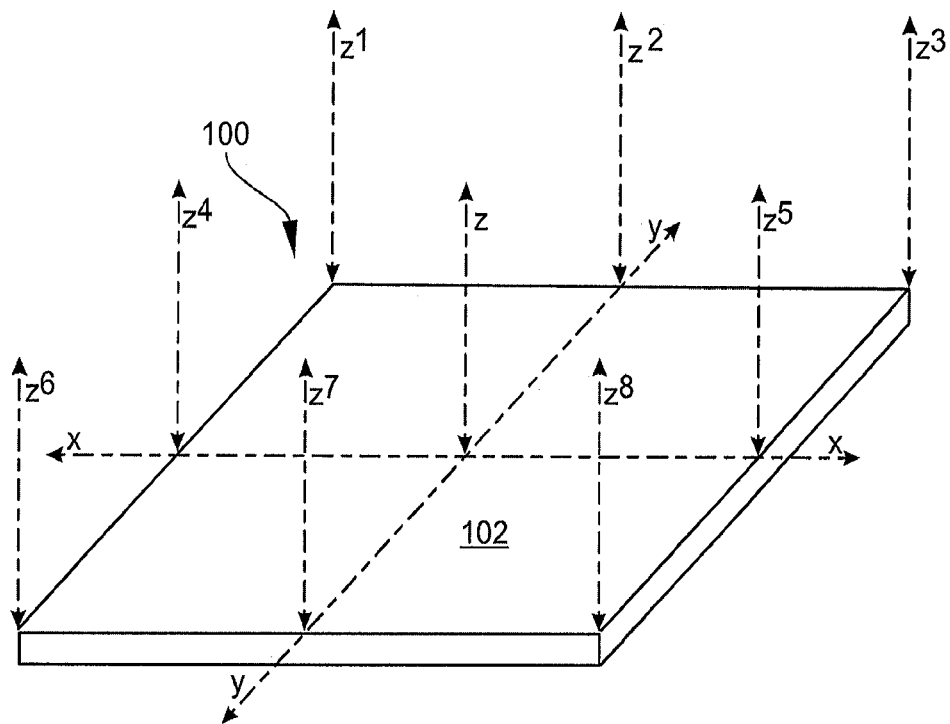

The batteries may be tested on the apparatus with motion parallel to the battery separator/electrode plane, orthogonal to the plane, and combinations thereof. FIG. 3 depicts additional axes of a z1-axis, z2-axis, z3-axis, z4-axis, z5-axis, z6-axis, z7-axis, and a z8-axis. In addition to translating along or about the x-axis, y-axis, and/or z-axis, exemplary embodiments of the testing apparatus 100 may be capable of motion along or about these multiple other axes in addition to or instead of those shown in FIG. 2. Furthermore, the axes depicted in FIG. 3 are merely exemplary and may be located anywhere through or adjacent to the platform surface. Likewise, motion along or about these axes may be similarly done in additional axes in the x and y directions such as is shown in FIG. 3 regarding the z direction.

Such motion may be accomplished by a variety of means, such as by electric motors, stepper motors, linear motors, pneumatics or hydraulics, and combinations thereof. All of the circuits for testing the batteries and programming the table motion and/or testing the battery or batteries may be self-contained on the apparatus by either a PLC or CPU, as examples.

The planar platform may be provided with means for securing one or more batteries thereto. A variety of means may be used, such as clamps, straps, mechanical fasteners, and/or the like, and combinations thereof. Overhead cables may be attached to the batteries being tested with enough slack such that the motion of the platform and batteries does not tangle them.

Figure 4B:
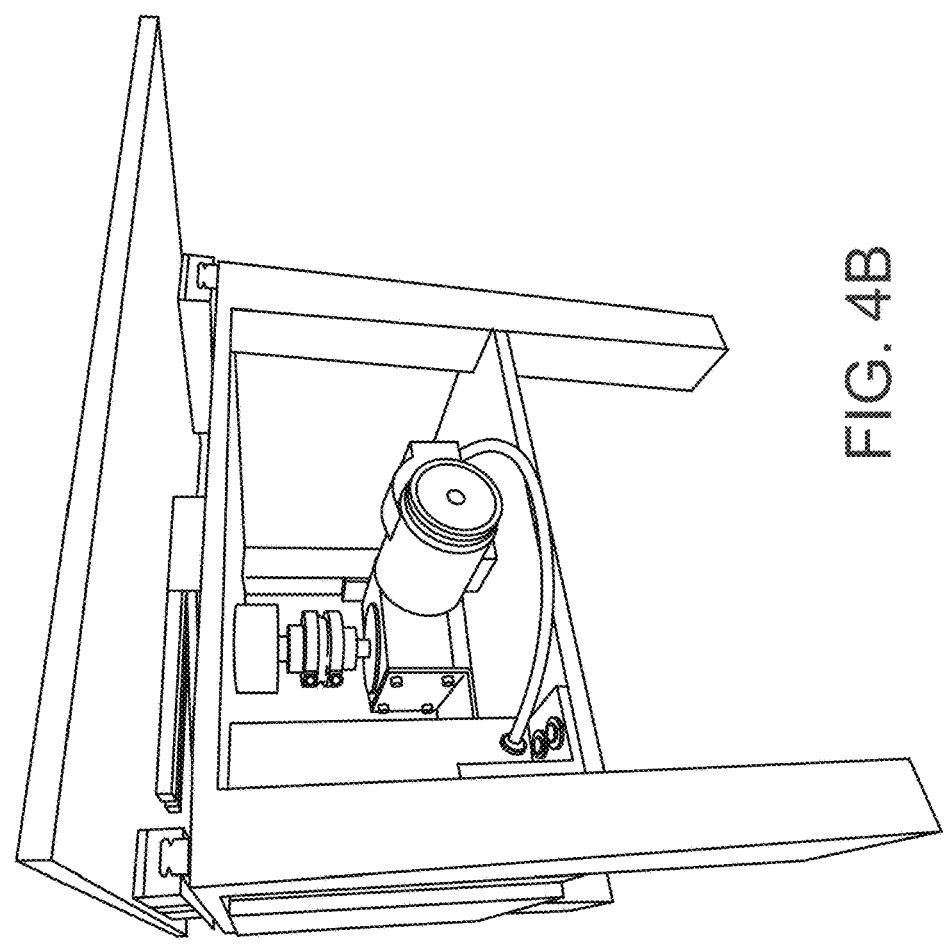
FIGS. 4A and 4B are photographs of particular exemplary embodiments of the present invention.
Figure 4A:
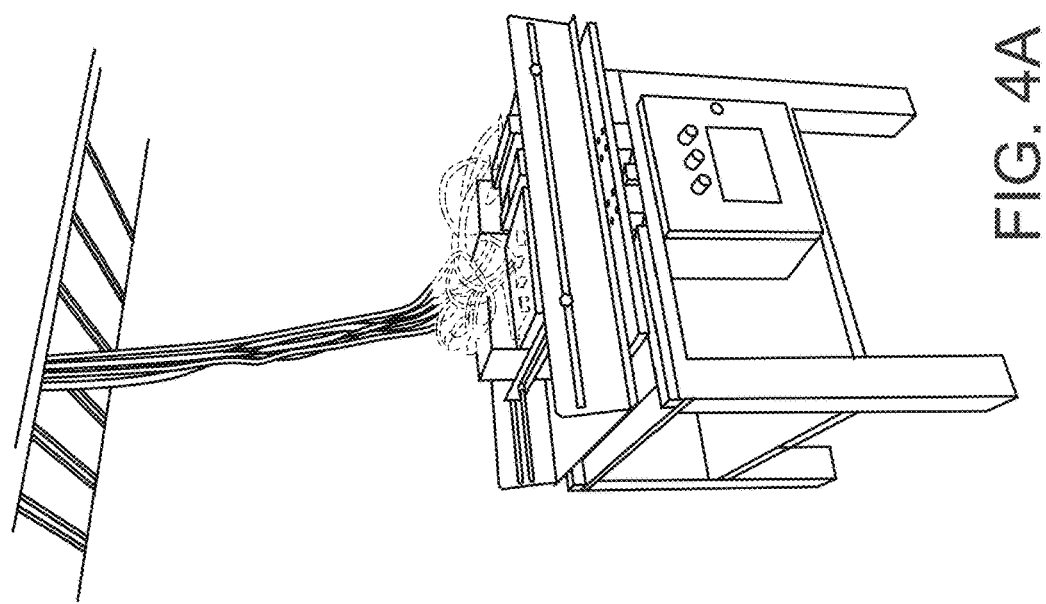

FIGS. 4A and 4B depict a possibly preferred exemplary embodiment of the present disclosure or invention. As can be seen, the device or system uses an electric motor to produce motion that is controlled by a PLC, is equipped with overhead cables, and has a means to secure multiple batteries.

In addition to motion, select embodiments are preferably capable of testing batteries in a variety of field conditions, such as varying or controlling the temperature, humidity, and/or the like, and combinations thereof. The apparatus may be placed in an environmental chamber to control the heat and humidity. Alternatively, the batteries may be heated in a variety of means such as, for example, natural of forced air convection, a radiant heat oven, heating pads or jackets above, below, or about the batteries. It is also envisioned that a water bath be placed on the testing platform. However, care must be taken to avoid splashing on the battery electrodes.

Select embodiments may test the batteries in a variety of charging and/or discharging profiles, such as discharging only during motion, charging only during motion, or cycling charging and discharging profiles during motion.

Figure 5:
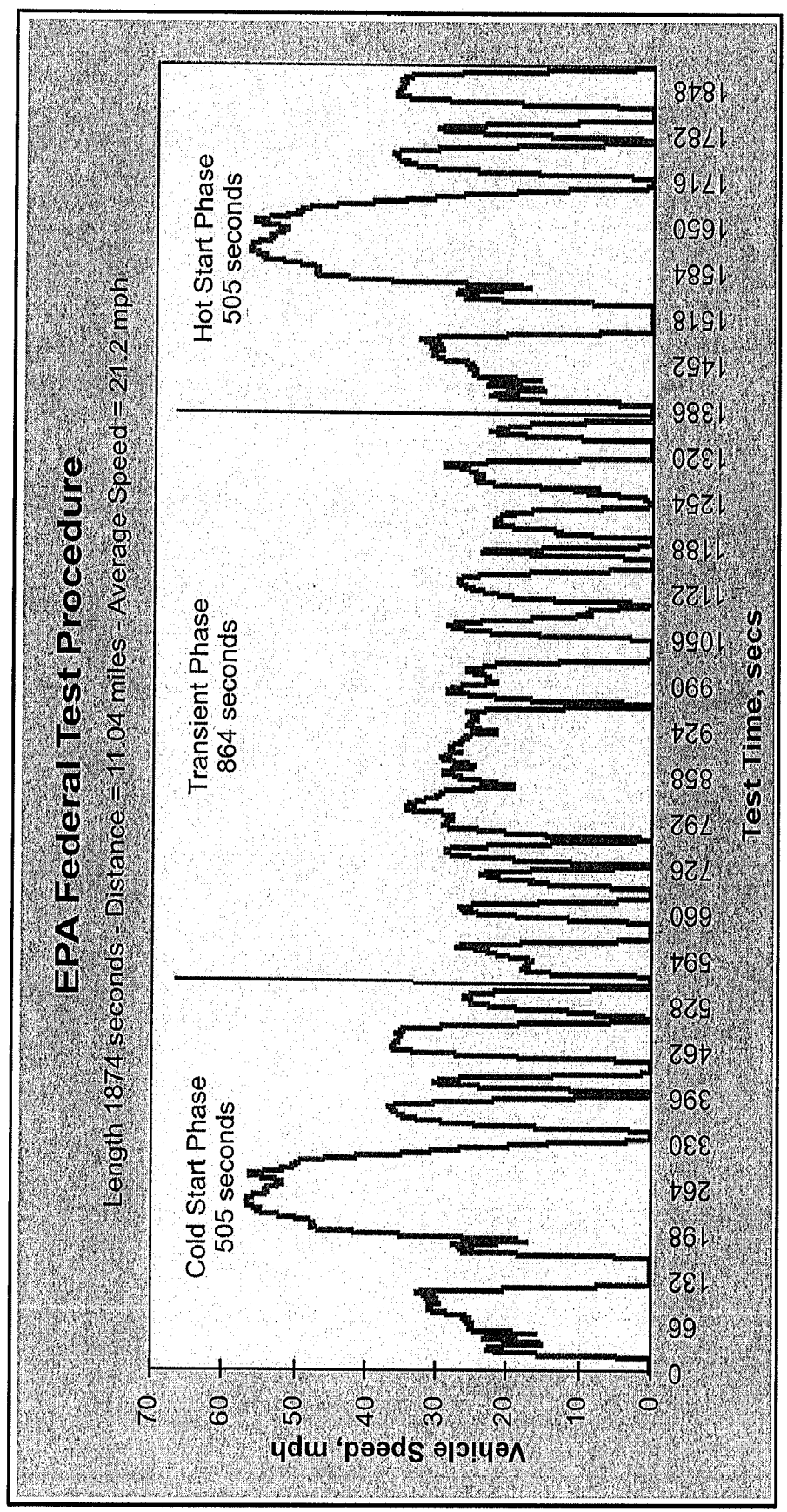
FIG. 5 is a chart illustrating an exemplary driving profile of an automobile in city driving.
Figure 6:
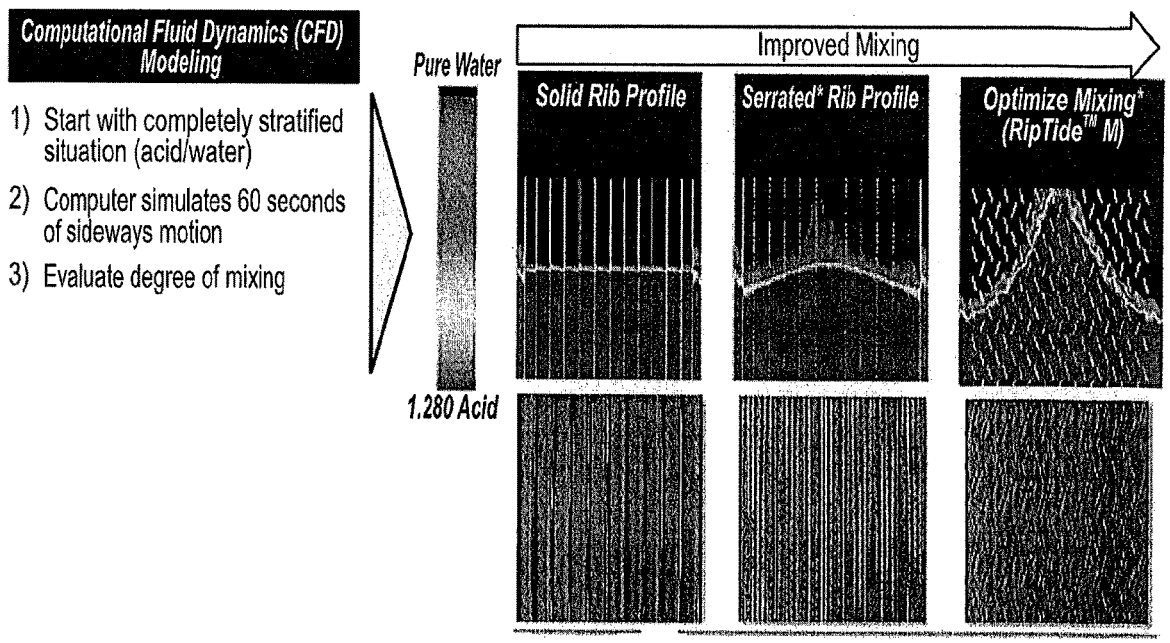
FIG. 6 is information on and images of acid mixing and modeling of acid mixing.
Figure 7:
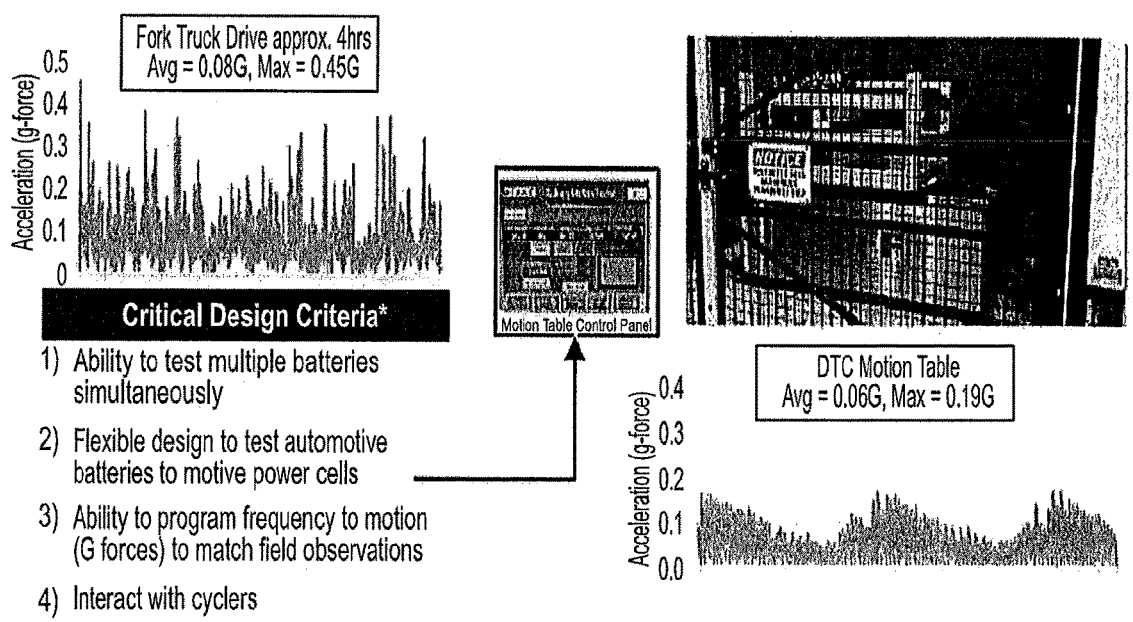
FIG. 7 is information on and images of inventive motion testing and equipment.
Figure 8:
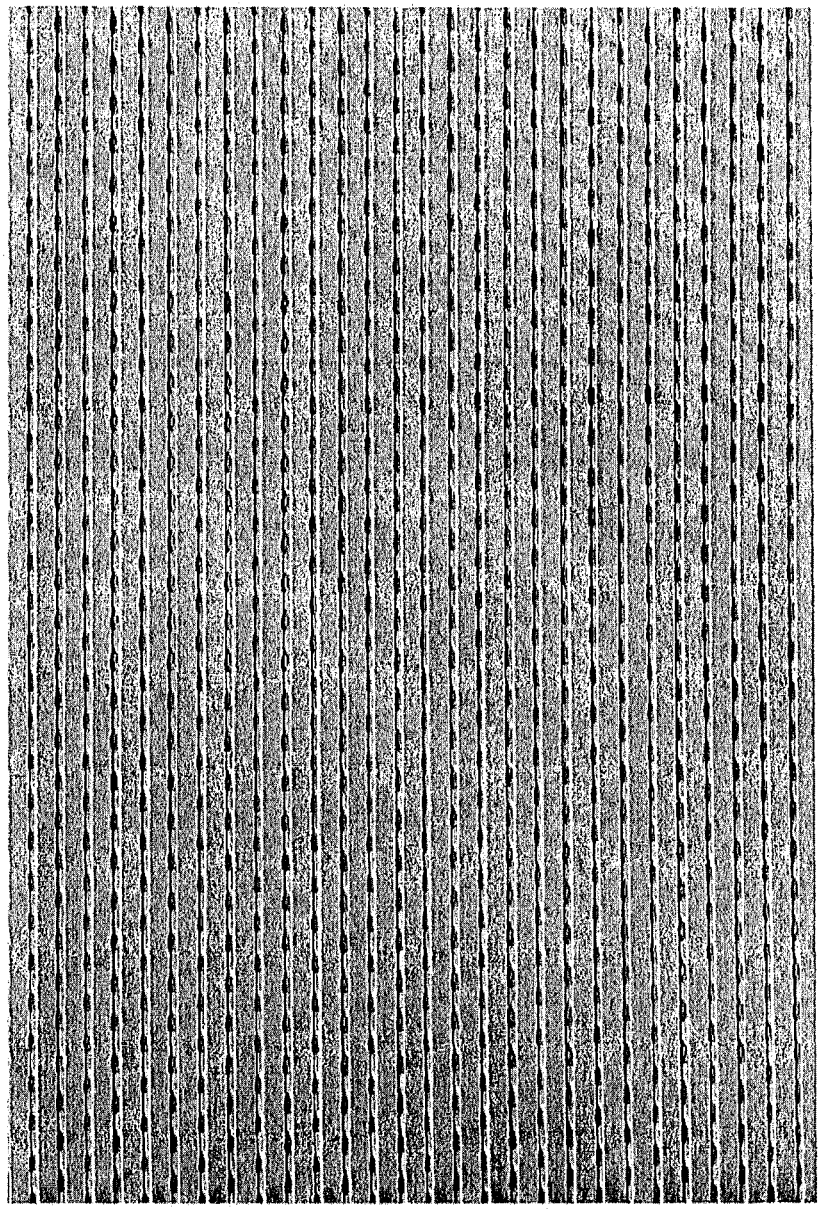
FIGS. 8 and 9 are respective photographic images of Daramic® acid mixing rib profiles.
Figure 9:
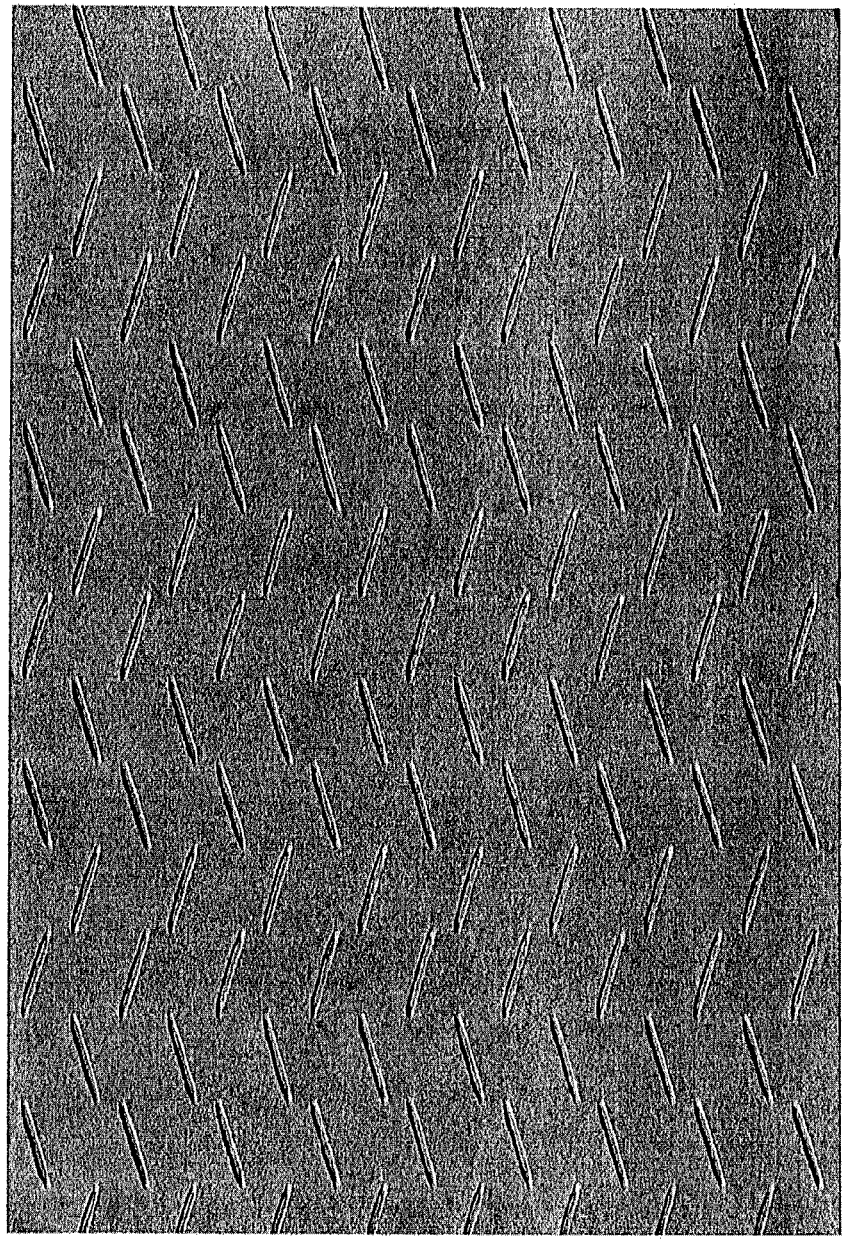
Figure 10:
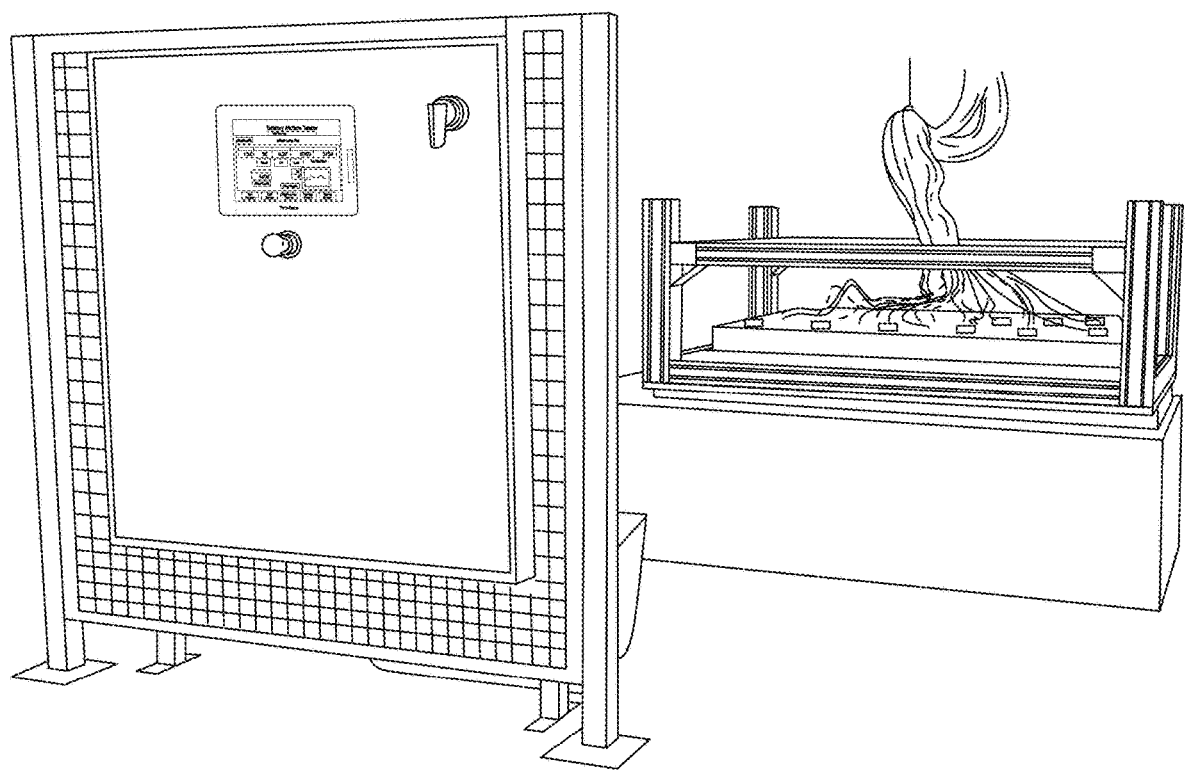
Figure 11:
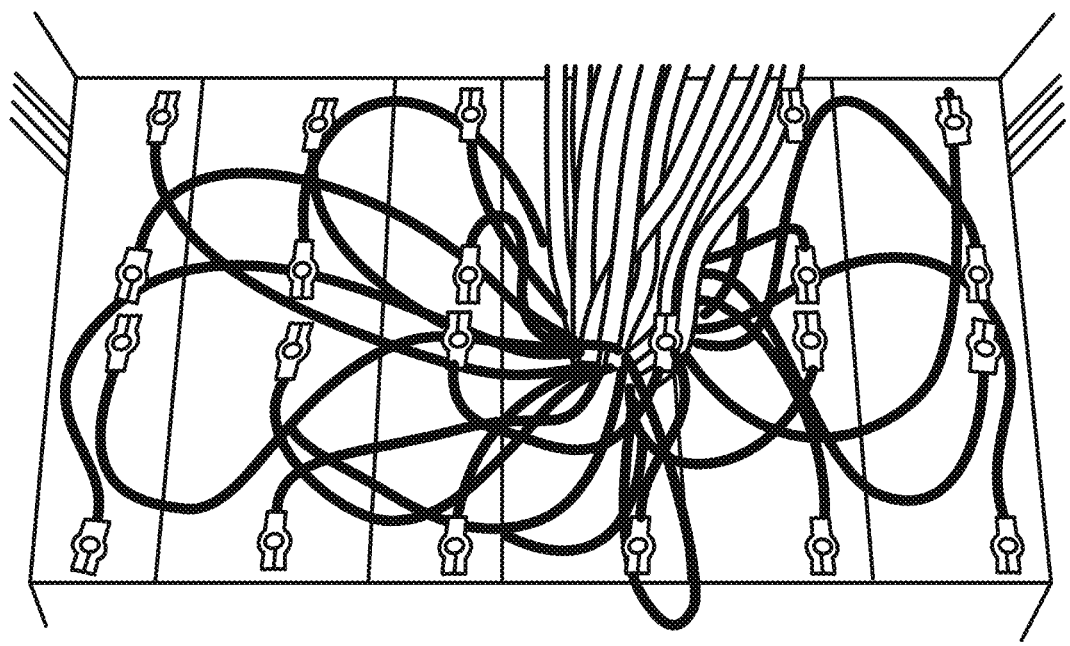
Figure 12:
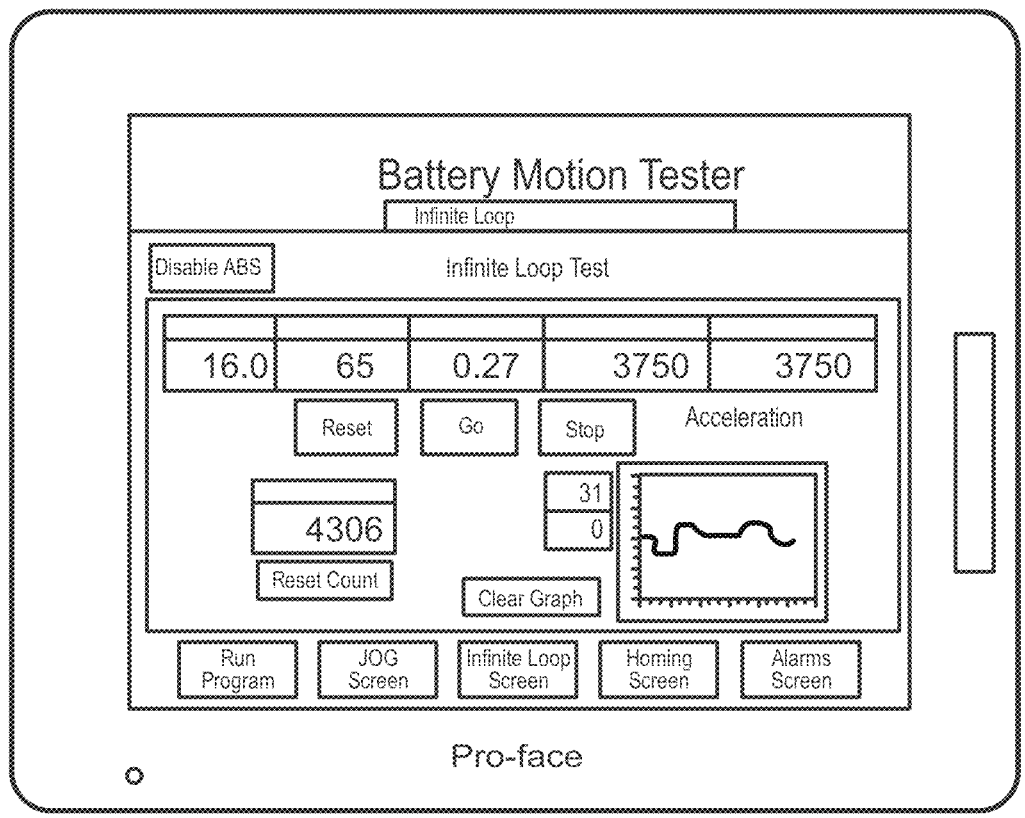
Figure 14:
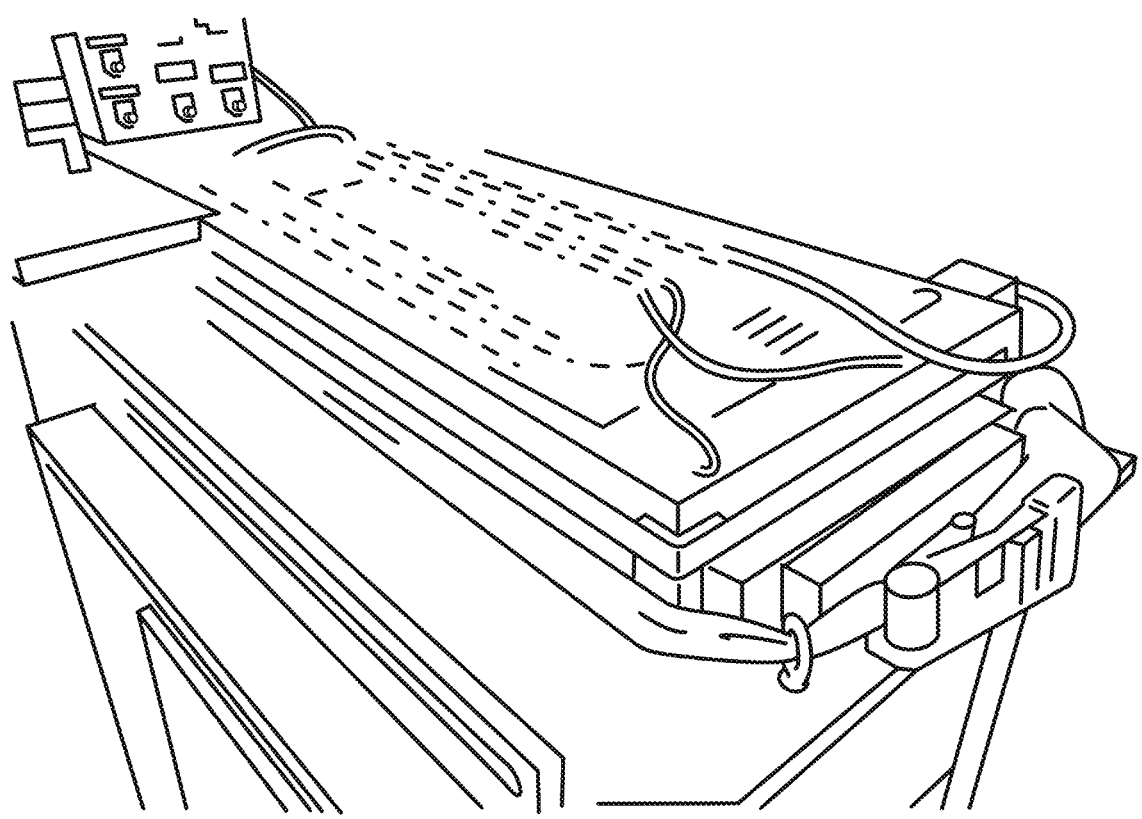
FIG. 14 is an image of a Daramic battery motion and rocker table in motion.

The testing apparatus is preferably capable of mimicking typical for an automobile, such as city driving in congested traffic. For example, the United States government publishes stop/start and acceleration/deceleration profiles for city and highway driving utilized in determining fuel efficiency for consumer information. Such profiles may be found at: https://www.fueleconomy.gov/feg/fe_test_schedules.shtml (accessed 14 Sep. 2017), and the profile for city driving is reproduced in FIG. 5. Stop/start and acceleration/deceleration profiles may also be created and reproduced on the testing apparatus for other vehicles as well.

The present invention may be embodied in other forms without departing from the spirit and the essential attributes thereof, and, accordingly, reference should be made to the appended claims, rather than to the foregoing specification, as indicating the scope of the invention. Disclosed are components that may be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that may be performed it is understood that each of these additional steps may be performed with any specific embodiment or combination of embodiments of the disclosed methods.

In a first exemplary embodiment of the present disclosure or invention, a method provides at least one lead acid battery; subjecting the lead acid battery or batteries to motion; wherein the motion is translating the lead acid battery or batteries in a first degree of freedom; the motion is rotating the lead acid battery or batteries in a second degree of freedom; and at least partially cycling the lead acid battery or batteries during the motion.

In one exemplary aspect of an embodiment, the first degree of freedom is the same as the second degree of freedom. In another aspect, the motion is translating the battery or batteries in a third degree of freedom, and/or an additional fourth degree of freedom. The motion may also be rotation about a third degree of freedom, and/or an additional fourth degree of freedom.

In another exemplary aspect, the electrolyte in the battery or batteries may be mixed. In addition, the temperature of the battery or batteries or the ambient humidity may be controlled.

In another exemplary aspect of the present invention, the motion may mimic the acceleration and deceleration of a vehicle. The motion may also mimic that of a vehicle during typical stop/start driving. The vehicle may be an automobile, a truck, a motorcycle, an all-terrain vehicle, a forklift, a golf cart, a hybrid-electric vehicle, an electric vehicle, an idle-stop-start vehicle, an e-rickshaw, an e-trike, an e-bike, a train, a vessel, and/or the like.

In yet another aspect of an embodiment of the present invention, the battery or batteries may be a flooded lead acid battery, an enhanced flooded lead acid battery, an idle-stop-start vehicle lead acid battery, an automobile battery, a truck battery, a motorcycle battery, an all-terrain vehicle battery, a forklift battery, a golf cart battery, a hybrid-electric vehicle battery, an electric vehicle battery, an e-rickshaw battery, an e-trike battery, an e-bike battery, a train, a vessel, and/or the like.

In still another aspect of the present disclosure or invention, the method may test a battery or batteries while at least partially cycling them while the battery or batteries are in motion. The partial cycling may be at least partially discharging, at least partially charging, or a combination thereof. The method may include testing a battery or batteries in motion in a partial state of charge ("PSoC").

In yet another aspect of the present disclosure or invention, the method may also secure the battery or batteries to a generally planar platform. The first degree of freedom may be a first axis parallel to the generally planar platform, not parallel to the generally planar platform, or even orthogonal to the generally planar platform. In addition, the second degree of freedom may be a first axis parallel to the generally planar platform, not parallel to the generally planar platform, or even orthogonal to the generally planar platform. Furthermore, the second degree of freedom may be an axis coaxial with the first axis, not parallel to the first axis, and even orthogonal to the first axis.

In another exemplary embodiment of the present disclosure or invention, a system may be provided with at least one lead acid battery, a generally planar platform capable of securing the battery or batteries and movable in at least four degrees of freedom, and circuitry for at least partially cycling the battery or batteries. The cycling may be at least partially discharging the battery or batteries, at least partially charging the battery or batteries, or both at least partially charging and at least partially discharging the battery or batteries.

In at least one exemplary aspect of the system, the circuitry or a second circuitry may also be capable of controlling a motion of the generally parallel support platform about or along the at least four degrees of freedom, preferably about or along five degrees of freedom, and more preferably, along or about six degrees of freedom.

In yet another exemplary embodiment of the present disclosure or invention, a support apparatus for testing a lead acid battery may be provided with a generally planar support platform having one or more means of securing the lead acid battery. In at least one exemplary aspect, the support platform may be translatable along three separate axes, and rotatable about at least one axis of the three separate axes. The support platform may preferably be rotatable about at least two axes of the three separate axes, and more preferably rotatable about all three separate axes.

In still another exemplary embodiment of the present disclosure or embodiment, a support apparatus for testing a lead acid battery may be provided with a generally planar support platform having one or more means of securing the lead acid battery. In at least one exemplary aspect, the support platform may be rotatable about three separate axes, and translatable along at least one axis of the three separate axes. The support platform may preferably be translatable along at least two axes of the three separate axes, and more preferably translatable along all three separate axes.

In accordance with at least selected embodiments, aspects, or objects, the present disclosure or invention is directed to novel or improved testing apparatus for testing lead acid batteries and/or their components, and/or the efficacy of their components, testing tables, testing systems, and/or related methods; novel or improved methods for testing lead acid batteries and/or their components, and/or the efficacy of their components; novel or improved systems for testing lead acid batteries and/or their components, and/or the efficacy of their components; novel or improved apparatus and methods for testing a lead acid battery or batteries whereby the battery or batteries are subjected to motion typical of that experienced by the battery or batteries in use or in the field; and/or the like.

The foregoing written description of structures and methods has been presented for purposes of illustration only. Examples are used to disclose exemplary embodiments, including the best mode, and also to enable any person skilled in the art to practice the invention, including making and using any devices or systems and performing any incorporated methods. These examples are not intended to be exhaustive or to limit the invention to the precise steps and/or forms disclosed, and many modifications and variations are possible in light of the above teaching. Features described herein may be combined in any combination. Steps of a method described herein may be performed in any sequence that is physically possible. The patentable scope of the invention is defined by the appended claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The compositions and methods of the appended claims are not limited in scope by the specific compositions and methods described herein, which are intended as illustrations of a few aspects of the claims. Any compositions and methods that are functionally equivalent are intended to fall within the scope of the claims. Various modifications of the compositions and methods in addition to those shown and described herein are intended to fall within the scope of the appended claims. Further, while only certain representative compositions and method steps disclosed herein are specifically described, other combinations of the compositions and method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

As used in the specification and the appended claims, the singular forms "a," "an," and "the" include plural referents unless the context clearly dictates otherwise. Ranges may be expressed herein as from "about" or "approximately" one particular value, and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. "Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers, or steps. The terms "consisting essentially of" and "consisting of" may be used in place of "comprising" and "including" to provide for more specific embodiments of the invention and are also disclosed. "Exemplary" or "for example" means "an example of" and is not intended to convey an indication of a preferred or ideal embodiment. Similarly, "such as" is not used in a restrictive sense, but for explanatory or exemplary purposes.

Other than where noted, all numbers expressing geometries, dimensions, and so forth used in the specification and claims are to be understood at the very least, and not as an attempt to limit the application of the doctrine of equivalents to the scope of the claims, to be construed in light of the number of significant digits and ordinary rounding approaches.

Unless defined otherwise, all technical and scientific terms used herein have the same meanings as commonly understood by one of skill in the art to which the disclosed invention belongs. Publications cited herein and the materials for which they are cited are specifically incorporated by reference.

Additionally, the invention illustratively disclosed herein suitably may be practiced in the absence of any element which is not specifically disclosed herein.

What is claimed is:

1. A method for testing a lead acid battery comprising:
providing at least one lead acid battery or cells;
subjecting said at least one lead acid battery or cells to motion; wherein
said motion is translating said lead acid battery or cells in at least a first degree of freedom;
said motion is rotating said lead acid battery or cells in at least a second degree of freedom; and,
at least partially cycling said at least one lead acid battery or cells during said motion.

2. The method for testing a lead acid battery of claim 1, wherein said first degree of freedom is the same as the second degree of freedom.

3. The method for testing a lead acid battery of claim 1, wherein said motion is translating said at least one lead acid battery or cells in a third degree of freedom.

4. The method for testing a lead acid battery of claim 3, wherein said motion is translating said at least one lead acid battery or cells in a fourth degree of freedom.

5. The method for testing a lead acid battery of claim 1, wherein said motion is rotating said at least one lead acid battery or cells in a range from approximately 0° to approximately +/−180°.

6. The method for testing a lead acid battery of claim 1, wherein said motion is rotating said at least one lead acid battery or cells about a third degree of freedom.

7. The method for testing a lead acid battery of claim 6, wherein said motion is rotating said at least one lead acid battery or cells about a fourth degree of freedom.

8. The method for testing a lead acid battery of claim 1, wherein said motion is translating and said motion is rotating are performed simultaneously.

9. The method for testing a lead acid battery of claim 1, further comprising:
mixing an electrolyte within said at least one lead acid battery or cells.

10. The method for testing a lead acid battery of claim 1, further comprising:
controlling a temperature of said at least one lead acid battery or cells.

11. The method for testing a lead acid battery of claim 1, further comprising:
controlling humidity about said at least one lead acid battery or cells.

12. The method for testing a lead acid battery of claim 1, wherein said motion mimics acceleration and deceleration of a vehicle or vessel in one or both of a translational movement and an angular movement.

13. The method for testing a lead acid battery of claim 12, wherein said acceleration and said deceleration mimics that of said vehicle during typical stop/start driving.

14. The method for testing a lead acid battery of claim 12, wherein said acceleration and said deceleration ranges from approximately 0 g to approximately +/−0.75 g.

15. The method for testing a lead acid battery of claim 1, wherein said motion mimics vibrational movement.

16. The method for testing a lead acid battery of claim 12, wherein said vehicle or vessel is selected from the group consisting of: an automobile, a truck, a motorcycle, an all-terrain vehicle, a forklift, a golf cart, a hybrid-electric vehicle, an electric vehicle, an idle-stop-start vehicle, an e-rickshaw, an e-trike, an e-bike, a ship, a boat, a vessel, a train, or combinations thereof.

17. The method for testing a lead acid battery of claim 1, wherein said at least one lead acid battery is selected from the group consisting of: a flooded lead acid battery, an enhanced flooded lead acid battery, an idle-stop-start vehicle lead acid battery, an automobile battery, a truck battery, a motorcycle battery, an all-terrain vehicle battery, a forklift battery, a golf cart battery, a hybrid-electric vehicle battery, an electric vehicle battery, an e-rickshaw battery, an e-trike battery, an e-bike battery, a ship battery, a boat battery, a marine battery, a train battery, and a vessel battery.

18. The method for testing a lead acid battery of claim 1, wherein said at least partially cycling is performed while said at least one lead acid battery is in a partial state of charge.

19. The method for testing a lead acid battery of claim 1, wherein said at least partially cycling is performed while said at least one lead acid battery is discharging.

20. The method for testing a lead acid battery of claim 1, wherein said at least partially cycling is performed while said at least one lead acid battery is charging.

21. The method for testing a lead acid battery of claim 1 further comprising: securing said at least one lead acid battery to a generally planar platform.

22. The method for testing a lead acid battery of claim 21, wherein said first degree of freedom is a first axis parallel to said generally planar platform.

23. The method for testing a lead acid battery of claim 21, wherein said first degree of freedom is a first axis that is not parallel to said generally planar platform.

24. The method for testing a lead acid battery of claim 21, wherein said second degree of freedom is a second axis parallel to said generally planar platform.

25. The method for testing a lead acid battery of claim 21, wherein said second degree of freedom is a second axis that is not parallel to said generally planar platform.

26. The method for testing a lead acid battery of claims 24, wherein said second degree of freedom is a second axis that is coaxial with said first axis.

27. The method for testing a lead acid battery of claims 24, wherein said second degree of freedom is a second axis that is not coaxial with said first axis.

28. A support apparatus for testing a lead acid battery, comprising:
a generally planar support platform having one or more means for securing the lead acid battery;
said support platform being translatable along three axes; and
wherein said support platform is rotatable about at least one of said three axes.

29. The support apparatus for testing the lead acid battery of claim 28, wherein said support platform is rotatable about at least two of said three axes.

30. The support apparatus for testing the lead acid battery of claim 28, wherein said support platform is rotatable about said three axes.

31. A support apparatus for testing a lead acid battery, comprising:
a generally planar support platform having one or more means for securing the lead acid battery;
said support platform being rotatable about three axes; and
wherein said support platform is translatable along at least one of said three axes.

32. The support apparatus for testing the lead acid battery of claim 31, wherein said support platform is translatable along at least two of said three axes.

33. The support apparatus for testing the lead acid battery of claim 31, wherein said support platform is translatable along said three axes.

34. A method for testing a lead acid battery comprising:
providing at least one lead acid battery;
subjecting said at least one lead acid battery to motion; wherein
said motion is translating said at least one lead acid battery in at least a first degree of freedom;
said motion is rotating said at least one lead acid battery in at least a second degree of freedom; and,
at least partially cycling said at least one lead acid battery during said motion.

35. The method of claim 34, wherein said at least one lead acid battery includes an acid electrolyte, positive and negative electrodes or plates, and a separator between the positive and negative electrodes.

36. The method of claim 35, wherein said separator includes an acid mixing rib profile on at least one side thereof.

37. The method of claim 35, wherein said separator includes an acid mixing rib profile on both sides thereof.

38. The method of claim 35, wherein said separator is a polyethylene microporous membrane type separator.

39. The method of claim 35, wherein said separator includes a nonwoven, glass mat, synthetic mat, slyver mat, AGM, PAM retention mat (PRM), or NAM retention mat (NRM) on at least one side thereof.

40. The method of claim 35, wherein said separator includes a nonwoven, glass mat, synthetic mat, slyver mat, AGM, PAM retention mat (PRM), or NAM retention mat (NRM) on both sides thereof.

41. The method of claim 35, wherein said separator includes ribs, mini ribs, cross mini ribs, negative cross ribs (NCR), protrusions, numbs, serrated ribs, battlemented ribs, angled ribs, broken ribs, acid mixing ribs, acid holding ribs, or combinations thereof on at least one side thereof.

42. The method of claim 35, wherein said separator includes ribs, mini ribs, cross mini ribs, negative cross ribs (NCR), protrusions, numbs, serrated ribs, battlemented ribs, angled ribs, broken ribs, acid mixing ribs, acid holding ribs, or combinations thereof on both sides thereof.

43. The method of claim 42, wherein said ribs are the same on both sides.

44. The method of claim 42, wherein said ribs are different on each side.

45. The method of claim 39, wherein said separator includes ribs, mini ribs, cross mini ribs, negative cross ribs (NCR), protrusions, numbs, serrated ribs, battlemented ribs, angled ribs, broken ribs, acid mixing ribs, acid holding ribs, or combinations thereof on one or both sides thereof, and includes a nonwoven, glass mat, synthetic mat, slyver mat, AGM, PAM retention mat (PRM), or NAM retention mat (NRM) on one or both sides thereof.

46. A method for testing a lead acid battery comprising:
providing at least one lead acid battery or cells;
subjecting said at least one lead acid battery or cells to motion; wherein said motion is rotating said lead acid battery or cells in at least a first degree of freedom; and,
at least partially cycling said at least one lead acid battery or cells during said motion.

* * * * *